United States Patent
Duineveld et al.

(10) Patent No.: US 7,651,957 B2
(45) Date of Patent: Jan. 26, 2010

(54) STRUCTURE FOR A SEMICONDUCTOR ARRANGEMENT AND A METHOD OF MANUFACTURING A SEMICONDUCTOR ARRANGEMENT

(75) Inventors: Paulus Cornelis Duineveld, Eindhoven (NL); Gerwin Hermanus Gelinck, Eindhoven (NL)

(73) Assignee: Polymer Vision Limited, Eindhoven (NL)

( * ) Notice: Subject to any disclaimer, the term of this patent is extended or adjusted under 35 U.S.C. 154(b) by 244 days.

(21) Appl. No.: 10/557,622

(22) PCT Filed: May 13, 2004

(86) PCT No.: PCT/IB2004/050669

§ 371 (c)(1),
(2), (4) Date: Nov. 17, 2005

(87) PCT Pub. No.: WO2004/105104

PCT Pub. Date: Dec. 2, 2004

(65) Prior Publication Data

US 2006/0281332 A1    Dec. 14, 2006

(30) Foreign Application Priority Data

May 20, 2003    (EP) .................................. 03101431

(51) Int. Cl.
*H01L 21/31*    (2006.01)
*H01L 21/469*   (2006.01)

(52) U.S. Cl. ............... 438/780; 438/758; 257/E21.492; 257/E21.299

(58) Field of Classification Search ................. 438/780; 257/642

See application file for complete search history.

(56) References Cited

U.S. PATENT DOCUMENTS

| 4,791,302 A | * | 12/1988 | Nozue ..................... 250/491.1 |
| 6,416,886 B1 | | 7/2002 | Gyoutoku et al. |
| 2004/0021810 A1 | * | 2/2004 | Kawaguri et al. ........... 349/113 |

FOREIGN PATENT DOCUMENTS

| EP | 0 989 778 | 3/2000 |
| EP | 1 335 418 | 8/2003 |

* cited by examiner

*Primary Examiner*—Walter L Lindsay, Jr.
*Assistant Examiner*—Abdulfattah Mustapha
(74) *Attorney, Agent, or Firm*—Leydig, Voit & Mayer Ltd.

(57) ABSTRACT

The invention relates to a structure for a semiconductor arrangement. A resist structure for supporting deposition of a solution containing a semiconductor is directly or through intervening layers coupled to a substrate. The resist structure comprises a depression (301) for depositing of the solution containing the semiconductor (309) and a trough (305) aligning at least part of an edge of the depression (309) and separated from the depression (309) by a protrusion (307). The trough (305) preferably surrounds the depression (309). The trough provides a pinning effect on the solution containing the semiconductor thereby improving the wettability and accordingly allowing for increased volume of semiconductor to be applied to a given area.

22 Claims, 4 Drawing Sheets

STRUCTURE FOR A SEMICONDUCTOR ARRANGEMENT AND A METHOD OF MANUFACTURING A SEMICONDUCTOR ARRANGEMENT

The invention relates to a structure for a semiconductor arrangement and a method of manufacturing a semiconductor arrangement and in particular to a semiconductor arrangement comprising a resist structure.

It has for many years been known to manufacture electronic semiconductor components such as bipolar and field effect transistors using semiconductor materials such as silicon, germanium and gallium arsenide. Specifically, integrated circuits comprising many electronic components are manufactured by depositing conductive, semiconductive and insulating layers on a substrate.

In recent years, it has been realized that some organic materials, such as for example Pentacene, Polythiophene, Polyfluorene, Polyphenylenevinylene, Triphenylamines may exhibit semiconductor properties. Semiconductor components, arrangements and circuits comprising organic semiconductors promise a number of advantages over traditional semiconductor based structures including ease of processing, e.g. solution processing and their mechanical flexibility. Accordingly, much research has been undertaken in the field of organic semiconductors and manufacturing of semiconductor components and circuits based on organic semiconductors.

Also, in recent years, semiconductor based displays such as thin film transistor (TFT) displays have become increasingly widespread. Accordingly, much research has been undertaking in suitable manufacturing methods for semiconductor structures and in particular for manufacturing of organic semiconductor structures or semiconductor based displays.

One known method for manufacturing an organic semiconductor based display comprises applying the organic transistors of the display by spin coating. However the disadvantage of this technology is that a uniform layer of semi conducting material is applied requiring a separate patterning process. Therefore, a typically preferred method of applying the polymer is by use of printing processes, such as ink-jet printing, whereby the semiconducting organic material may be directly applied in a pattern. In this way, the functional characteristics of the transistor can be improved considerably.

To simplify the ink-jet printing process, i.e. to keep the ink-jet printed liquid in the desired areas, the structure on which the liquid is printed typically comprises a resist structure, which prevents the printed liquid to spread to unwanted areas.

Generally, the resist structures comprise wells or cavities that can be filled with liquid material by means of printing. FIG. 1 illustrates a cross section of a well of a resist structure in accordance with prior art. The resist structure 101 comprises a well 103 formed as a depression in the resist structure 101. A droplet 105 of a solution containing the organic semiconductor has been dropped in the well 103.

In the situation where the angle of the liquid with the resist $\theta$ is larger than the advancing contact angle of the liquid with the substrate, wetting of the resist will occur until equilibrium is established, i.e. the angle of the liquid on the substrate is equal to the advancing contact angle. FIG. 2 illustrates a cross section of a well of a resist structure in accordance with prior art. FIG. 2 illustrates the same resist structure as in FIG. 1 but after the equilibrium has been reached. As can be seen a significant wetting of the resist has occurred. This results in a number of disadvantages including poor control over the feature size (this makes it impossible to make small features), poor registration (this may lead to undesired leakage currents and parasitic capacitances).

The wetting of the resist depends on the contact angle of the liquid with the resist and also, for a given liquid volume, on the height of the resist barrier. A possible solution to reduce the wetting may accordingly be to increase the height of the resist barrier. However, a thick resist layer on top of other display elements, such as the pixel electrode, negatively affects the display performance as higher driving voltages are required and the electrode becomes less transparent which can lead to a reduced front of screen performance in reflective displays. Further, the mechanical stability decreases with a higher aspect ratio of the resist structures.

Another option to increase the contact angle by a surface treatment, e.g. a $CF_4$, or $CHF_3$ plasma would increase the contact angle of the liquid with the substrate. Such a treatment, however, appears to be unfavorable for the transistor characteristics.

Hence, an improved structure for a semiconductor arrangement and method of manufacturing a semiconductor arrangement would be advantageous and in particular an improved structure that reduces wettability for a solution containing a semiconductor would be advantageous.

Accordingly, the Invention preferably seeks to mitigate, alleviate or eliminate one or more of the above mentioned disadvantages singly or in any combination.

According to a first aspect of the invention, there is provided a structure for a semiconductor arrangement, comprising: a resist structure coupled to a substrate; the resist structure comprising a depression for depositing of a solution containing a semiconductor or a precursor thereof, and a trough aligning at least part of an edge of the depression and separated from the depression by a protrusion.

The invention allows for the solution containing a soluble semiconductor (or a precursor thereof) to have an increased volume without extending beyond the trough. The contact angle relevant to wettability of the solution containing the semiconductor may be the contact angle between the surface of the solution containing the semiconductor and the surface of a wall of the trough rather than of the general surface plane of the resist structure. Accordingly, by forming the side of the trough to provide a higher angle with respect to the surface of the solution containing the organic semiconductor than the surface next to the depression an increased contact angle and thus reduced wettability may be achieved.

The resist structure may enlarge the maximum contact angle (which is a measure for the wettability) with respect to the general substrate surface plane from typical values around for example 10-20° to about 90° or even more.

The invention allows for improved definition of the area to be covered by the solution containing the organic semiconductor and for a substantially increased solution containing the organic semiconductor volume to be deposited for each depression.

The resist structure may preferably have depth of between 0.5 and 15 µm, and in particular a depth of between 2 and 5 µm has been found to provide particular advantageous results. The depression may similarly preferably have a depth of between 0.5 and 15 µm and in particular a depth of between 2 and 5 µm as been found to provide particular advantageous results. The trough width is not critical but may for example be in the region of 2 to 15 µm. The distance between the depression and the first side of the trough is preferably also between 2 and 15 µm. Typically the concentration of the semiconductor in the solution is within the range of 0.1% to 10% and often in the order of 1%.

Different shapes of the protrusion may be used, including a rectangular cross-section, a truncated cone, an inverse truncated cone (e.g. with the wall having at the bottom a width that is smaller than at the top), or a side wall with a rounded top.

The resist structure is coupled to the substrate but is not necessarily in direct contact with the substrate. Thus, other layers may be situated between the substrate and the resist structure. The resist structure may specifically be formed in a layer, which is part of a functional layer of the semiconductor arrangement, or in a layer used in the manufacturing process. For example, the resist structure may be formed in a gate dielectricum layer, insulator layer between interconnect lines or a photo resist layer used for patterning of underlying layers.

The resist structure can be made in various ways including photolithography, embossing, microcontact printing and injection molding.

According to a feature of the invention, the resist structure is formed in a single layer of the semiconductor arrangement.

According to another feature of the invention, the trough substantially surrounds the depression. This provides improved wettability in all directions.

According to another feature of the invention, the semiconductor is an organic semiconductor.

According to another feature of the invention, a width of an end of the protrusion distal from the substrate is larger than a width of an end of the protrusion proximal to the substrate. A protrusion of increasing width may provide for an increasing contact angle, which may extend beyond 90°.

According to another feature of the invention, a width of an end of the protrusion proximal to the substrate is larger than a width of an end of the protrusion distal from the substrate. A protrusion of decreasing width may achieve increased mechanical robustness of the protrusion and may allow a desired reduced maximum contact angle to be achieved.

According to another feature of the invention, the protrusion has a substantially frusto-conical cross section. This allows for a protrusion which has suitable mechanical and resist properties and which is suitable for a low complexity manufacturing process.

According to another feature of the invention, the resist structure is formed by a polymer layer. A polymer material has properties which are particularly suitable for formation of a resist structure for a semiconductor arrangement and especially when an organic semiconductor is used.

According to another feature of the invention a cross section of the depression substantially perpendicular to the direction of depression comprises rounded corners. The edge of the depression when viewed from above the substrate may preferably be smooth and without sharp edges, corners or discontinuities. This allows for an improved contact between the solution containing the semiconductor and the resist and improves wettability.

According to another feature of the invention, a cross section of the depression substantially perpendicular to the direction of depression is substantially rectangular. The edge of the depression when viewed from above the substrate is preferably substantially rectangular but preferably has rounded corners. This allows for a particularly suitable shape for depositing semiconductors for example for forming of Field Effect Transistors.

According to another feature of the invention, a depth of the trough is substantially the same as a depth of the depression. This allows for a simple manufacturing process wherein the trough and the depression may be formed by the same operation using the same parameters. Specifically, the depth of both the depression and the trough may be equal to the depth of the resist layer thereby allowing the depression and trough to be formed by removal of the entire layer at the appropriate locations, for example by an etching technique.

According to another feature of the invention, the depression comprises a semiconductor forming the active layer of a field effect transistor. Hence, the invention allows for a structure which is suitable for accurate depositing of a semiconductor for a field effect transistor. A simple manufacturing process may be achieved.

According to another feature of the invention, the field effect transistor comprises a source and drain having a plurality of interdigitated electrodes and a gate extending across the plurality of interdigitated electrodes.

According to another feature of the invention, the depression extends beyond the gate in a direction substantially perpendicular to the longitudinal direction of the interdigitated fingers. This provides for particularly suitable transistor parameters and allows for the semiconductor to, in the substantially perpendicular direction, extend beyond the channel areas defined by the conductors of the field effect transistor. This mitigates or prevents that a small deviation in the overlay between the cavity and the underlying layers results in a variation of parasitic capacitances. This is particularly advantageous if the transistor is part of a display, where a variation in overlap may have a negative effect on the display quality.

According to another feature of the invention, the depression does not extend beyond the gate in a direction substantially aligned with the longitudinal direction of the interdigitated fingers. This provides for particularly suitable transistor parameters and prevents the semiconductor extending, in the substantially aligned direction, beyond the channel areas defined by the conductors of the field effect transistor. This is particularly important for normally on transistors. For normally on transistors, the organic semiconductor can already carry charge carriers from source to drain and/or vice versa when the applied voltage on the gate-electrode is zero. An extension beyond the gate leads to a leakage path between source and drain electrode.

The structure may preferably be used in an integrated circuit, a (thin film) transistor active matrix display, an active matrix backplane or an electroluminescent device.

According to a second aspect of the invention, there is provided a method of manufacturing a semiconductor arrangement; the method comprising the steps of: providing a substrate; applying a resist structure coupled to the substrate; the resist structure comprising a depression for depositing of a solution containing a semiconductor or a precursor thereof, and a trough aligning at least part of an edge of the depression and separated from the depression by a protrusion; and depositing the solution in the depression.

Preferably, the depositing of the solution containing the organic semiconductor is by a printing process such as micro contact printing, micromoulding in capillaries (MIMIC), drop-on-demand ink jet printing (bubble jet or piezo-electric), continuous ink-jet printing, screen printing or flexographic printing.

These and other aspects, features and advantages of the invention will be apparent from and elucidated with reference to the embodiment(s) described hereinafter.

An embodiment of the invention will be described, by way of example only, with reference to the drawings, in which FIG. 1 illustrates a cross section of a well of a resist structure in accordance with prior art;

The following description focuses on an embodiment of the invention applicable to an organic semiconductor structure. However, it will be appreciated that the invention is not limited to this application but may be applied to many other semiconductor arrangements.

Semiconductor arrangements and structures used for example for forming field effect transistors in integrated circuits or semiconductor based displays (e.g. thin film transistor (TFT) displays) are typically formed by depositing and patterning different layers on a substrate. A well-known and cheap method of depositing suitable materials is spin coating. This is typically followed by a patterning process, which may for example comprise a photolithographic exposure of a photoresist followed by an etching step as is well known in the art.

However, in recent years other techniques have emerged for manufacturing semiconductor arrangements. A very advantageous technique is direct printing of e.g. a solution containing the semiconductor or a precursor thereof on a resist layer. For example, ink jet printing allows for a droplet of solution containing the semiconductor to be deposited at a desired location. As the droplets can be very small and can be positioned accurately, it is possible to provide the desired pattern directly by the printing process without requiring a separate patterning step.

The semiconductor material may be of different constitution, including inorganic semiconductors such as CdSe (provided as precursor), nanomaterial-type semiconductors, in the form of particles or in the form of nanotubes or nanowires and organic semiconductors.

In order to facilitate and assist the accurate depositing of a solution containing the semiconductor, the resist structure preferably comprises a well for each droplet deposited by the printing process. For example, if a TFT display is manufactured, a matrix of evenly distributed pixel FETs is formed over the display area. Each droplet of solution containing the semiconductor may be deposited so as to form the channel of the pixel FET. Hence, before the ink jet printing of the solution containing the semiconductor, the resist is provided with an evenly distributed array of wells having a size corresponding to the desired semiconductor size. Typically, such wells are rectangular and may for example have a length of 400 μm, a width of 50 μm and a depth of 5 μm. In other embodiments, the well or depression may of course have other dimensions depending on the requirements of the specific embodiment. In some embodiments, a plurality of droplets may be deposited in a single depression.

Figure 1:
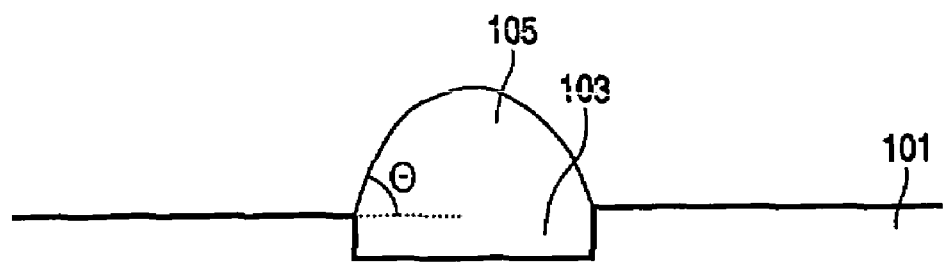
Figure 2:
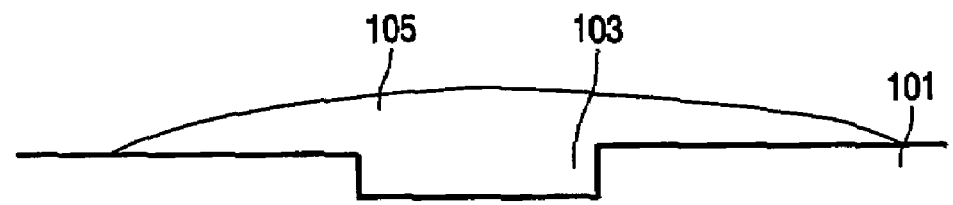
FIG. 2 illustrates a cross section of a well of a resist structure in accordance with prior art.
Figure 3:
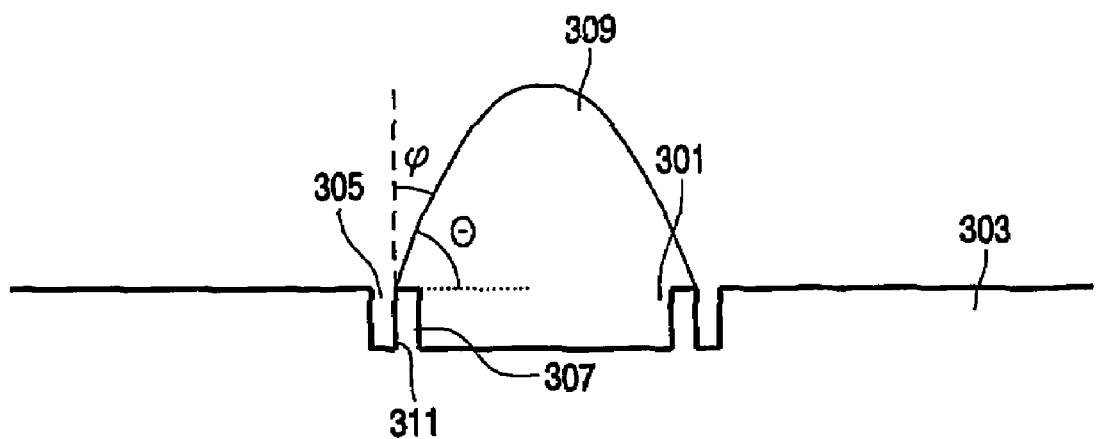
FIG. 3 illustrates a cross section of a resist structure in accordance with an embodiment of the invention.

FIG. 3 illustrates a cross section of a resist structure in accordance with an embodiment of the invention. The resist structure is coupled to the substrate on which the semiconductor arrangement is formed either directly or fully or partially through intervening layers.

A depression 301 for depositing of a solution containing the semiconductor is formed in a resist 303. In addition, a trough 305 aligning at least part of an edge of the depression 301 is formed in the resist 303. The trough 305 is separated from the depression 301 by a protrusion 307.

During printing, a droplet 309 of solution containing the semiconductor is dropped in the depression 301. The surface of the droplet will form an angle θ with the plane of the resist. In the prior art resist structure, wetting will occur when θ exceeds a given value which typically is in the area of 10-20°.

However, as illustrated in FIG. 3, when the droplet 309 comes into contact with the trough 305 the relevant contact angle is no longer that of the surface of the droplet 309 and the plane of the resist Rather, the relevant contact angle for the wetting effect is that between the surface of the droplet 309 and the surface in which it is in contact, which in this case is the side 311 of the trough 305. Thus the relevant contact angle for the continued wetting of the solution containing the semiconductor is that of φ. As illustrated in FIG. 3 this angle is much lower than θ. In the shown example, the θ is approximately 60° (which would cause further wetting), whereas the angle φ is approximately −30°. Thus in the shown example where the side wall of the trough is substantially perpendicular to the plane of the resist 303, the angle θ between the droplet surface and the plane of the substrate at which wetting occurs is approximately 90° higher than without the presence of the trough. Thus, the function of the trough line is to pin the liquid.

Hence in accordance with the shown embodiment, a much improved wetting performance of the resist structure is achieved by the provision of a trough aligning the edge of the depression. The maximum contact angle may thus be increased substantially. This allows, for example, for a much increased amount of semiconductor material to be provided within a given area. This provides the advantage of a self-aligned process which prevents wetting of the resist area outside of the depression, applying a thicker semi-conductor layer inside the depression and having a more robust and reproducible process.

It should be noted that the above described pinning process assumes that the contact angle between the solution containing the semiconductor and the resist surface is the predominant effect controlling the wetting characteristics. It will be appreciated by the person skilled in the art that other effects, such as Marangoni forces, due to a gradient in surface tension, may have an impact on the wetting of the solution containing the organic semiconductor and that therefore the obtained improvement may be less than described in the given example.

It should be noted that FIG. 3 illustrates the structure for a single semiconductor deposit e.g. corresponding to a single transistor. Specifically, the transistor may be a pixel transistor for a display. In a semiconductor arrangement comprising a plurality of transistors, other troughs and depressions will be formed in the resist structure. For example, for a matrix display, other transistors will be formed at a given distance L from the shown transistor (typically in two perpendicular directions). Thus other depressions may be formed in the resist layer at a maximum distance L of at most the pixel dimension, which will typically be 100-1000 μm. The transistor for the adjacent pixel will be formed using this depression.

For some purposes, it may be advantageous to decrease the height of the base resist layer to that of the depression at a much smaller distance. For example, the trough may be formed by the protrusion and an outer wall which is of the same magnitude or even smaller than the protrusion. In other words, the resist layer may in some embodiments be removed from areas where it is not used to form depressions or troughs.

In the preferred embodiment, the depression and the trough are formed in the same layer and have the same depth. This allows for a simple manufacturing process where no differentiation is required between the trough and the depression. Specifically, the depth of the trough and the depression is preferably equal to the depth of the layer, such that the depression and the layer can be performed simply by removing the entire layer.

The resist layer preferably has a thickness in the order of 1-5 µm. Preferably the resist area covers the entire area of the semiconductor arrangement but in some embodiments the resist is absent outside the area wherein the depressions are formed.

The pattern of the resist structure can be formed using different techniques known to the person skilled in the art including photolithography, embossing, microcontact printing, or injection molding.

The resist structure is preferably made of a polymer material and the solution containing the organic semiconductor is preferably an organic semiconductors including, the polyphenylenevinylenes, the polythienylene-vinylenes, polyfluorenes, blends of carrier materials and oligomers, (particularly pentacene), polyarylamines, polythiophenes, and the like, copolymers of oligomers and non-semiconducting monomers. These organic semiconductors may include any side-chains (alkyl-, alkoxygroups in particular but not exclusively) as known to the skilled person in the art. The resist layer may furthermore have a second purpose. For example, the resist layer may also be used as an isolator between e.g. the second and third metal layer, which is patterned with an additional mask. In view of underlying layers, use of wet-chemical etching is preferred. The dielectric layer is preferred above the photo resist, in order to avoid that the photo resist has an undesired impact on the stability of the organic semiconductor.

The deposition of the solution containing the semiconductor is preferably by a printing process but it is within the contemplation of the invention that any suitable process may be used. The printing may for example be by drop-on-demand ink jet printing (which may e.g. be bubble jet or piezo electric printing), continuous ink-jet printing, screen printing, flexographic printing, micro contact printing or Micromoulding in capillaries (MIMIC).

Figure 4:
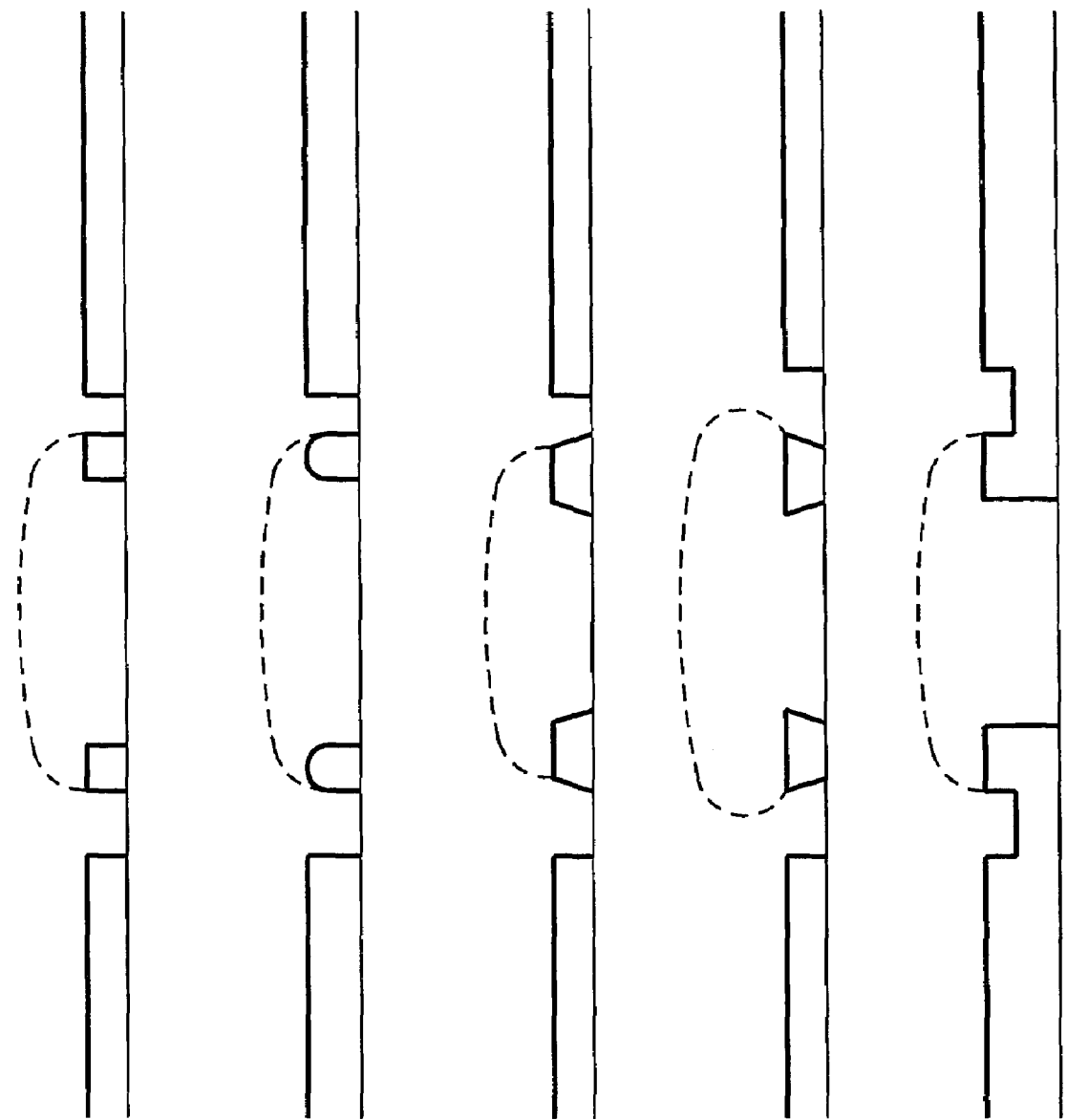
FIG. 4 illustrates examples of cross-sections of a protrusion in accordance with embodiments of the invention.

The cross-sectional shape or dimensions of the protrusion may be determined by the person skilled in the art to suit the specific application. FIG. 4 illustrates examples of cross-sections of a protrusion in accordance with an embodiment of the invention.

As illustrated, the cross section may for example be rectangular, have rounded edges or be frusto-conical. Especially, the frusto conical shape is advantageous as it allows for a simple structure, which allows for an optimization of the maximum contact angle.

In some embodiments, a width of an end of the protrusion distal from the substrate is larger than a width of an end of the protrusion proximal to the substrate. For example, the width of the protrusion illustrated in FIG. 4 may be larger at the top of the protrusion than at the bottom.

Such an inverse truncated cone shape of the intermediate wall is particularly advantageous as it allows that the printed liquid (droplet) has a contact angle with respect to the substrate of more than 90°; i.e. with a relatively thin layer for the resist structure, it is possible to provide a large amount of material.

In other embodiments, a width of an end of the protrusion proximal to the substrate is larger than a width of an end of the protrusion distal from the substrate. For example, the width of the protrusion illustrated in FIG. 4 may be smaller at the top of the protrusion than at the bottom. This allows for smaller maximum contact angles but may provide a more mechanically robust structure.

Figure 5:
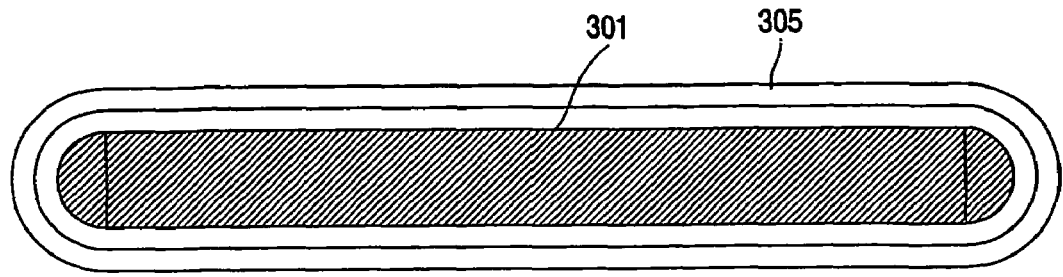
FIG. 5 illustrates a top view of a resist structure in accordance with an embodiment of the invention.

FIG. 5 illustrates a top view of a resist structure in accordance with an embodiment of the invention. FIG. 5 corresponds to a top view of the resist structure of FIG. 3.

As shown in FIG. 5, the trough 305 preferably substantially surrounds the depression. Thus, the trough preferably restricts the flow of a droplet in all directions along the plane of the resist layer.

Furthermore, as illustrated, the preferred shape of the depression corresponds to a substantially rectangular shape wherein the corners are rounded. Thus, in the preferred embodiment, no discontinuities or sharp corners exist in the edge of the depression in the direction substantially perpendicular to the direction of depression, i.e. in the plane of the resist layer. This allows for an improved wetting performance as thus reduces excess liquid in specific positions along the edge.

The resist structure and solution containing the semiconductor is in the preferred embodiment part of a field effect transistor (FET) structure. Thus the resist structure is used in facilitating the formation of one or more FETs.

Figure 6:
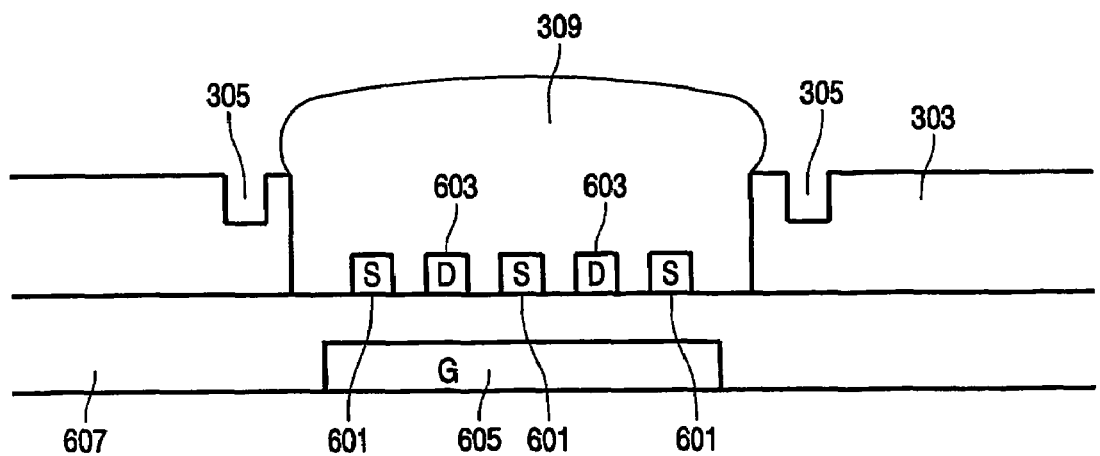
FIG. 6 illustrates a cross section of a bottom gate structure FET comprising a structure in accordance with an embodiment of the invention.

Generally, a FET with an organic semiconductor can have two structures: a bottom-gate structure or a top-gate structure. FIG. 6 illustrates a cross section of a bottom gate structure FET comprising a structure in accordance with an embodiment of the invention.

The FET comprises three electrodes: source 601, drain 603 and gate 605. The source and drain electrodes 601, 603 are present in one electrically conducting layer, the gate electrode 605 in another electrically conducting layer. The organic semiconductor 309 is in contact with the source 601 and drain 603 electrode, and forms the channel between these electrodes. The liquid containing the semiconductor 309 is separated from the gate electrode 605 through a gate-dielectricum 607 (a perpendicular projection of the gate electrode onto the organic semiconductor overlapping with the channel). In the bottom-gate structure, the organic semiconductor may be provided as the last layer.

FIG. 6 illustrates the FET structure prior to drying which will typically evaporate the solvent and leave the dry semi-conducting layer to be contained within the depression.

Figure 7:
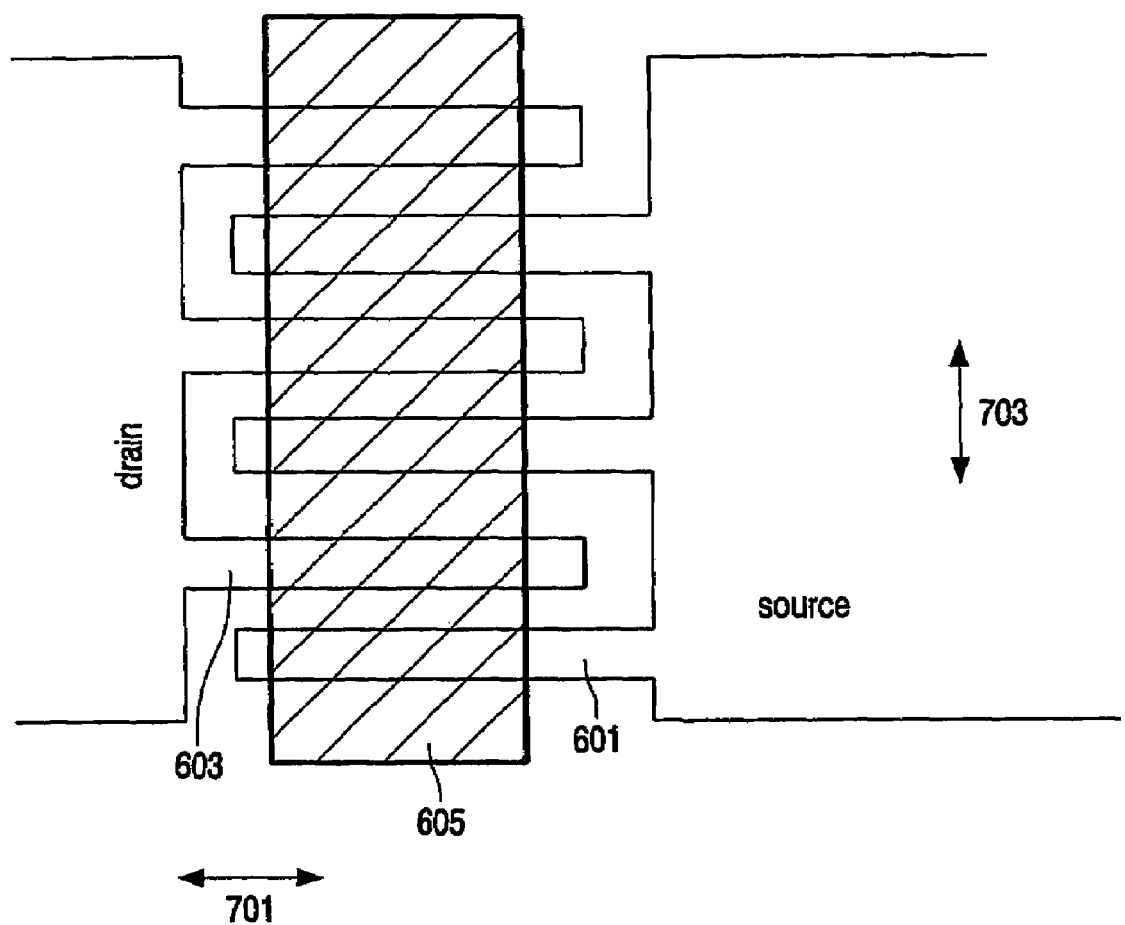
FIG. 7 illustrates a top view of the electrode layers of the FET of FIG. 6.

It is preferred that the source and drain electrodes 601, 603 are provided as a pair of interdigitated electrodes. FIG. 7 illustrates a top view of the electrode layers of the FET of FIG. 6.

As shown, the source and drain electrodes 601, 603 have fingers that are oriented substantially in parallel and which extend in a first direction 701. The gate is positioned such that its perpendicular projections overlap the fingers, but does not overlap the ends of the electrode fingers. It extends thus between a first and a second limit in the said a first direction 701. Preferably, the depression does not extend beyond the projected edges of the gate-electrode in the first direction 701. Thus, the depression does not extend beyond the gate in a direction substantially aligned with the longitudinal direction 701 of the interdigitated fingers.

This limitation is particularly advantageous for transistors with a normally on semiconductor material. In that case, the organic semiconductor can carry charge carriers from source to drain and/or vice versa when the applied voltage on the gate-electrode is zero or higher. An extension beyond the gate will lead to a leakage path between source and drain electrode, since the transport of charge carriers cannot be prevented by a gate voltage if no gate is overlapping this area.

Furthermore, the projection of the gate 605 extends in a second direction 703 (which is generally substantially perpendicular to the first direction) and overlaps the fingers of the source- and drain electrodes 601, 603 in this direction. In the preferred embodiment, the depression preferably extends beyond the projected edges of the gate-electrode 605 in the second direction 703. Thus, the depression preferably extends beyond the gate 605 in a direction 703 substantially perpendicular to the longitudinal direction of the interdigitated fingers.

By allowing the depression to overlap the gate in the second direction, it is prevented or mitigated that a small deviation in the overlay between the depression and the underlying layers has negative impact on the transistor characteristics.

Suitable electrically conducting materials for forming the source, drain and gate electrodes include gold, paladium, platinum and other (noble) metals, oxidic conductors, such as ITO, polymeric conductors such as polyaniline and polyethylenedioxythiophene (PEDOT), particularly in combination with a polyacid. For n-type semiconductor it is possible to use metals with lower work function besides the metals already mentioned for p-type semiconductors.

Suitable gate dielectrica include all kind of organic insulators, and in principle also inorganic insulators.

In the preferred embodiment, the semiconductor arrangement is part of an integrated circuit or a display or electroluminescent device.

Thus preferably, a multitude of FETs are formed using the described structure. Specifically, the FETs may be used in a display, for instance as pixel transistors in a display with an electrophoretic electro-optical layer.

The invention can be implemented in any suitable form and using any suitable methods, processes and materials. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units.

Although the present invention has been described in connection with the preferred embodiment, it is not intended to be limited to the specific form set forth herein. Rather, the scope of the present invention is limited only by the accompanying claims. In the claims, the term comprising does not exclude the presence of other elements or steps. Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is no feasible and/or advantageous. In addition, singular references do not exclude a plurality. Thus references to "a", "an", "first", "second" etc. do not preclude a plurality.

The invention claimed is:

1. A structure for a semiconductor arrangement; comprising a resist structure coupled to a substrate; the resist structure comprising:
    a depression for depositing of a solution containing a semiconductor or a precursor thereof and
    a trough aligning at least part of an edge of the depression and separated from the depression by a protrusion.

2. A structure as claimed in claim 1 wherein the resist structure is formed in a single layer of the semiconductor arrangement.

3. A structure as claimed in claim 1 wherein the trough substantially surrounds the depression.

4. A structure as claimed in claim 1 wherein the semiconductor is an organic semiconductor.

5. A structure as claimed in claim 1 wherein a width of an end of the protrusion distal from the substrate is larger than a width of an end of the protrusion proximal to the substrate.

6. A structure as claimed in claim 1 wherein a width of an end of the protrusion proximal to the substrate is larger than a width of an end of the protrusion distal from the substrate.

7. A structure as claimed in claim 5, wherein the protrusion has a substantially frusto-conical cross section.

8. A structure as claimed in claim 1 wherein the resist structure is formed by a polymer layer.

9. A structure as claimed in claim 1 wherein a cross section of the depression substantially perpendicular to the direction of depression comprises rounded corners.

10. A structure as claimed in claim 1 wherein a cross section of the depression substantially perpendicular to the direction of depression is substantially rectangular.

11. A structure as claimed in claim 1 wherein a depth of the trough is substantially the same as a depth of the depression.

12. A structure as claimed in claim 1 wherein the depression comprises a semiconductor forming an active layer of a field effect transistor.

13. A structure as claimed in claim 12 wherein the field effect transistor comprises a source and drain having a plurality of interdigitated electrodes and a gate extending across the plurality of interdigitated electrodes.

14. A structure as claimed in claim 13 wherein the depression extends beyond the gate in a direction substantially perpendicular to the longitudinal direction of the interdigitated fingers.

15. A structure as claimed in claim 14 wherein the depression does not extend beyond the gate in a direction substantially aligned with the longitudinal direction of the interdigitated fingers.

16. An electronic device comprising the resist structure of claim 1.

17. An electronic device, comprising a resist structure coupled to a substrate; the resist structure comprising:
    a depression for depositing of a solution containing a semiconductor or a precursor thereof and
    a trough aligning at least part of an edge of the depression and separated from the depression by a protrusion,
        wherein the depression comprises a semiconductor forming an active layer of a field effect transistor.

18. An electronic device comprising a resist structure coupled to a substrate; the resist structure comprising:
    a depression for depositing of a solution containing a semiconductor or a precursor thereof and
    a trough aligning at least part of an edge of the depression and separated from the depression by a protrusion, provided with
    an active matrix backplane or active matrix display comprising,
        a structure for a semiconductor arrangement; comprising a resist structure coupled to a substrate; the resist structure comprising:
    a depression for depositing of a solution containing a semiconductor or a precursor thereof and
    a trough aligning at least part of an edge of the depression and separated from the depression by a protrusion,
        wherein the depression comprises a semiconductor forming an active layer of a field effect transistor.

19. An electroluminescent device comprising the structure of claim 12.

20. A method of manufacturing a semiconductor arrangement; the method comprising the steps of:
provide a substrate;
applying a resist structure coupled to the substrate; the resist structure comprising a depression for depositing of a solution containing a semiconductor or a precursor thereof and a trough aligning at least part of an edge of the depression and separated from the depression by a protrusion; and
depositing the solution containing the semiconductor in the depression.

21. A method as claimed in claim 20 wherein the depositing of the solution is by a printing process.

22. A method as claimed in claim 21 wherein the depositing of the solution is by an ink jet printing process.

* * * * *

UNITED STATES PATENT AND TRADEMARK OFFICE
CERTIFICATE OF CORRECTION

PATENT NO. : 7,651,957 B2 Page 1 of 1
APPLICATION NO. : 10/557622
DATED : January 26, 2010
INVENTOR(S) : Duineveld et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 591 days.

Signed and Sealed this

Twenty-third Day of November, 2010

David J. Kappos
*Director of the United States Patent and Trademark Office*